United States Patent
Bandiera et al.

(10) Patent No.: US 8,643,130 B2
(45) Date of Patent: Feb. 4, 2014

(54) MAGNETIC STACK AND MEMORY CELL COMPRISING SUCH A STACK

(75) Inventors: Sebastien Bandiera, La Tronche (FR); Bernard Dieny, Lans En Vercors (FR); Bernard Rodmacq, Veurey Voroize (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 50 days.

(21) Appl. No.: 13/491,131

(22) Filed: Jun. 7, 2012

(65) Prior Publication Data
US 2012/0313192 A1 Dec. 13, 2012

(30) Foreign Application Priority Data
Jun. 7, 2011 (FR) ...................................... 11 54946

(51) Int. Cl.
- *H01L 27/22* (2006.01)
- *H01L 29/82* (2006.01)
- *H01L 21/00* (2006.01)
- *G11C 11/15* (2006.01)

(52) U.S. Cl.
USPC ................ 257/427; 257/421; 257/422; 438/3; 365/173

(58) Field of Classification Search
USPC ............ 257/421–427; 438/3, 57–98; 365/173
See application file for complete search history.

(56) References Cited

U.S. PATENT DOCUMENTS

| | | | | |
|---|---|---|---|---|
| 7,531,882 B2* | 5/2009 | Nguyen et al. | ................ | 257/421 |
| 7,862,912 B2* | 1/2011 | Hellwig et al. | ............ | 428/828.1 |
| 2002/0105827 A1* | 8/2002 | Redon et al. | .................. | 365/173 |
| 2006/0049472 A1* | 3/2006 | Diao et al. | .................... | 257/421 |
| 2006/0114615 A1* | 6/2006 | Pinarbasi | ...................... | 360/322 |
| 2007/0188945 A1* | 8/2007 | Fuji et al. | ................ | 360/324.12 |
| 2009/0162698 A1* | 6/2009 | Fukuzawa et al. | ......... | 428/811.2 |

FOREIGN PATENT DOCUMENTS

FR       2 817 999      6/2002

* cited by examiner

*Primary Examiner* — Fernando L Toledo
*Assistant Examiner* — Karen Kusumakar
(74) *Attorney, Agent, or Firm* — Pillsbury Winthrop Shaw Pittman LLP

(57) ABSTRACT

A magnetic stack with out of plane magnetisation, the magnetic stack including: a first magnetic layer constituted of one or more materials selected from the following group: cobalt, iron and nickel and magnetic alloys based on the materials; a second layer constituted of a metallic material able to confer to an assembly formed by the first and the second layers a perpendicular anisotropy of interfacial origin when the second layer has a shared interface with the first layer; and a third layer deposited on the first layer, the second layer being deposited on the third layer, the third layer being constituted of a metallic material having a miscibility less than 10% with the material of the first layer.

12 Claims, 7 Drawing Sheets

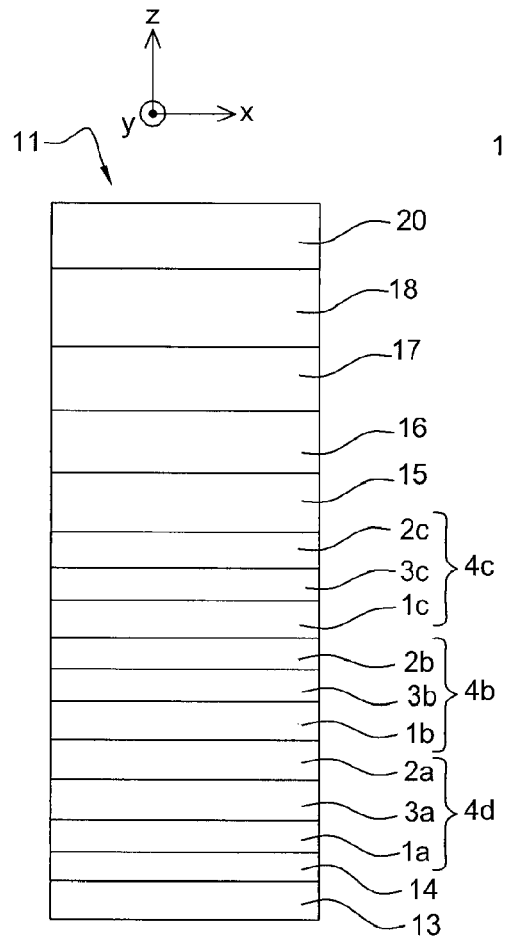
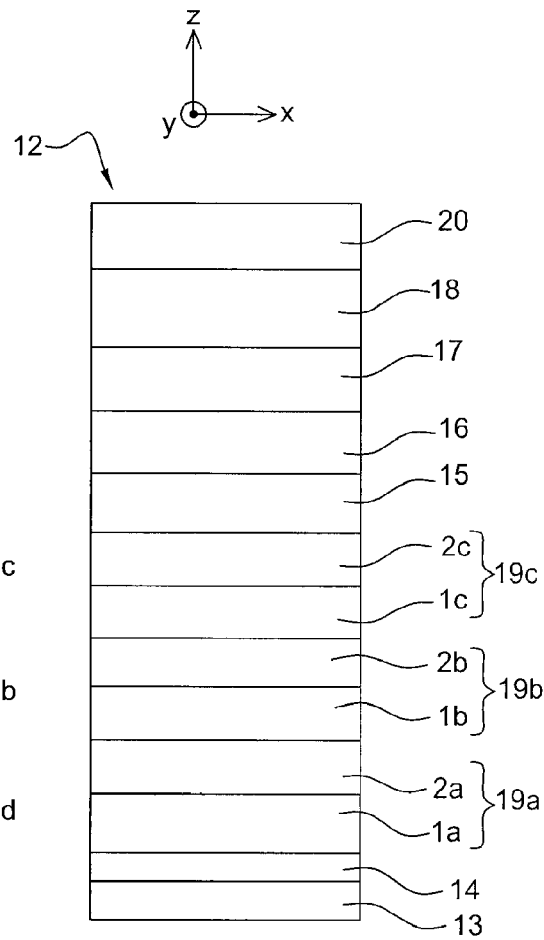
Fig. 7a  Fig. 7b
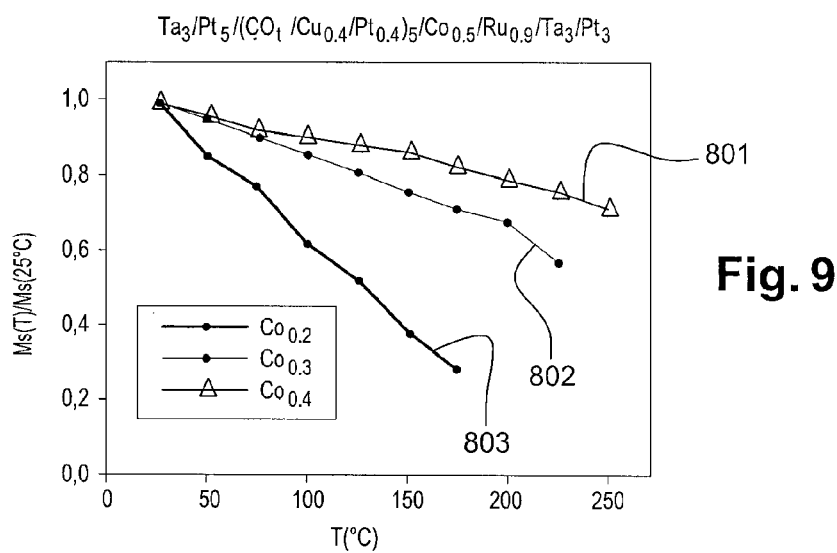
Fig. 9

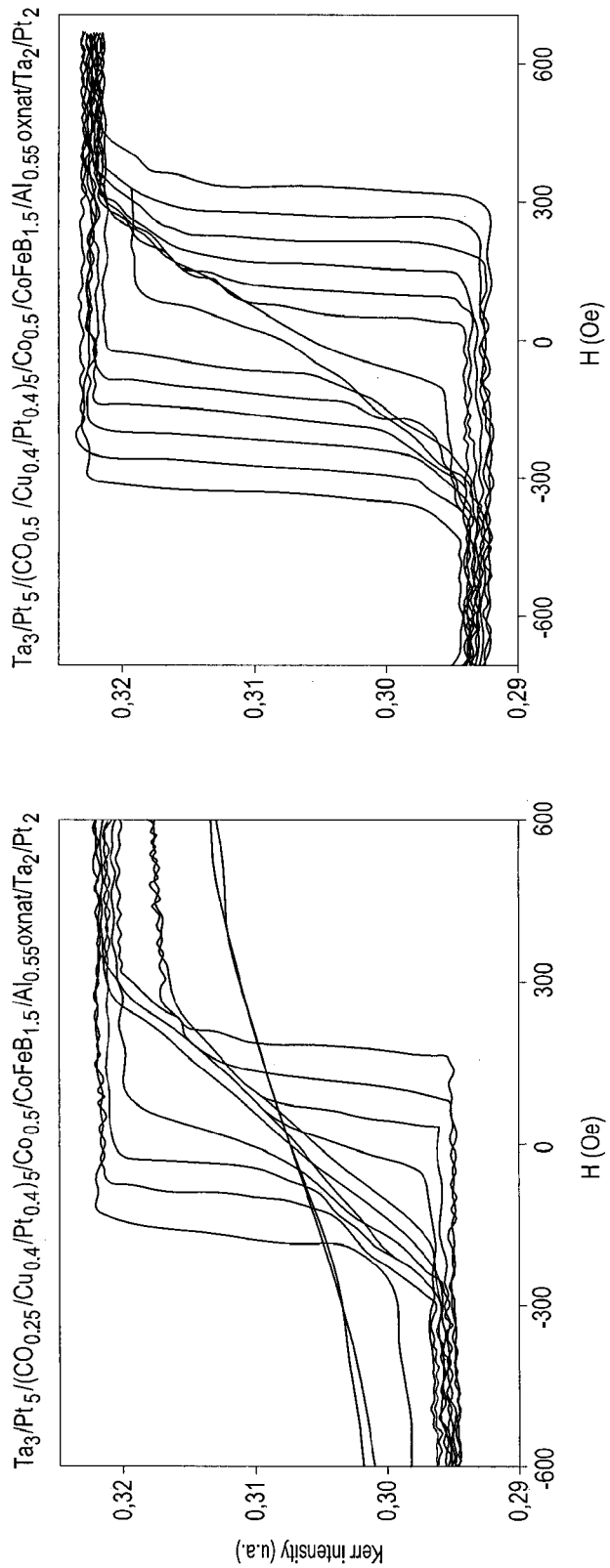
Fig. 10a
Fig. 10b
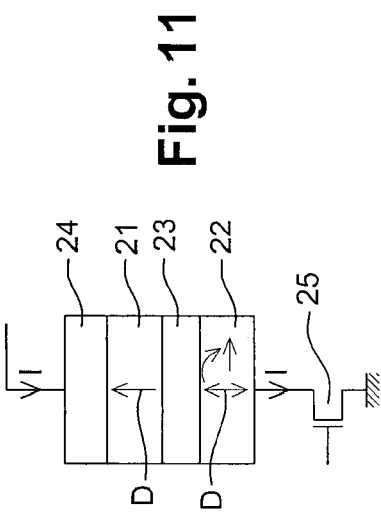
Fig. 11

MAGNETIC STACK AND MEMORY CELL COMPRISING SUCH A STACK

The present application claims priority and benefit to French Patent Application No. 1154946, filed Jun. 7, 2011, the content of which is incorporated herein in its entirety by reference.

The present invention relates to a magnetic stack with out of plane magnetisation. A magnetic stack with out of plane magnetisation or a magnetic stack with perpendicular magnetisation designates a magnetic stack that has a magnetisation substantially perpendicular to the plane along which the stack extends. The invention also relates to a multilayer with out of plane magnetisation that comprises such a magnetic stack, as well as a memory point comprising such a multilayer and magnetic random access memory comprising such a memory point.

Magnetic random access memories or MRAM are presented as a promising route to obtain efficient memory cells in terms of storage density, power consumption and reliability. These MRAMs generally include memory cells that comprise:
- a magnetic layer known as "reference layer" which has a magnetisation, the direction of which is fixed;
- a magnetic layer known as "storage layer" which has a magnetisation, the direction of which is variable and which can orient itself either parallel or antiparallel to the direction of magnetisation of the reference layer;
- a tunnel barrier that separates the reference layer and the storage layer.

The document FR2817999 describes for example such a memory cell.

Each memory cell generally has two modes of operation: a "reading" mode and a "writing" mode. In writing mode, a flow of electrons is sent through the layers or a magnetic field is applied to the storage layer of the memory point, so as to cause the reversal of the direction of magnetisation of the storage layer, which then becomes parallel or antiparallel to the direction of magnetisation of the reference layer. Depending on whether the direction of magnetisation of the storage layer is parallel or antiparallel to the direction of magnetisation of the reference layer, a "1" or a "0" is stored in the storage layer.

In reading mode, a flow of electrons is injected through the memory cell so as to read its resistance. When the directions of magnetisation of the reference layer and of the storage layer are parallel, the resistance of the memory point is low, whereas when the directions of magnetisation of the reference and storage layers are antiparallel, the resistance of the memory point is high. By comparison with a reference resistance, the value stored in the storage layer ("0" or "1") may be determined.

Generally, the reference and storage layers have directions of magnetisation that are parallel to the plane of each of said layers. One then speaks of magnetic layers with magnetisation in the plane or with planar magnetisation.

However, the first generations of MRAM memories, based on memory cells with planar magnetisation and with switching by magnetic field, are a long way from being able to compete with flash type memories because the available storage density is still too low. Yet, the reduction in the size of the memory points is limited in these MRAM memories by the current density that the field line can withstand and by the criterion of stability of retention of information over long periods, for example for 10 years, which imposes a minimum magnetic volume so as not to lose the information by thermal activation.

To address this, memory cells comprising layers with out of plane magnetisation have been developed. In this document, "layer or multilayer with out of plane magnetisation" designates a layer or a multilayer that has a magnetisation that is perpendicular to the plane of the layer or the multilayer. By extension, "memory cell with out of plane magnetisation" designates a memory cell that comprises such a layer.

Memory cells with out of plane magnetisation can have much smaller dimensions than memory cells with in plane magnetisation while conserving satisfactory stability. Moreover, they can be written by spin polarised current.

It is thus desirable to be able to manufacture materials with out of plane magnetisation that have as strong an anisotropy as possible so as to be able to reduce the size of the memory cell, and with a minimal magnetic thickness so as to reduce the critical switching current by spin transfer.

Numerous materials with perpendicular magnetisation have been developed in the past for information storage applications such as for example rare earth/magnetic transition metal alloys. The publication of X. Liu, A. Morisako, H. Sakurai, Y. Sakurai, M. Itou, and A. Koizumi, "*Perpendicular magnetic anisotropy in sputtered amorphous TbFeCo films*", J. Magn. Magn. Mater. 310, 1744-1746 (2007) describes such materials with out of plane magnetisation.

Granular materials such as cobalt-chromium-platinum alloys that have out of plane magnetisation are also known. Said materials are for example described in the publication of D. Watanabe, S. Mizukami, F. Wu, M. Oogane, H. Naganuma, Y. Ando, and T. Miyazaki, "*Interlayer exchange coupling in perpendicularly magnetized synthetic ferrimagnet structure using CoCrPt and CoFeB*", Journal of Physics: Conference Series 200, 072104 (2010).

Ordered $L1_0$ alloys of type FePt, CoPt, FePd, CoPd, etc., which have out of plane magnetisation are also known. Said materials are for example described in the publication of F. Casoli, F. Albertini, L. Pareti, S. Fabbrici, L. Nasi, C. Bocchi, and R. Ciprian, "*Growth and Characterization of Epitaxial Fe—Pt Films*", IEEE Trans. Magn. 41, 3223-3225 (2007) or in the publication of M. Yoshikawa, E. Kitagawa, T. Nagase, T. Daibou, M. Nagamine, K. Nishiyama, T. Kishi, and H. Yoda, "*Tunnel Magnetoresistance Over 100% in MgO-Based Magnetic Tunnel Junction Films With Perpendicular Magnetic $L1_o$-FePt Electrodes*", IEEE Trans. Magn. 44, 2573-2576 (2008), or instead in the publication of K. Barmak, J. Kim, L. H. Lewis, K. R. Coffey, A. J. Kellock, and J.-U. Thiele, "*On the relationship of magnetocrystalline anisotropy and stoichiometry in epitaxial $L1_0$ CoPt (001) and FePt (001) thin films*", J. Appl. Phys 98, 033904 (2005).

Another example of materials with out of plane magnetisation is also described in the publication of L. E. Nistor, B. Rodmacq, S. Auffret, and B. Dieny "*Pt/Co/oxide and oxide/Co/Pt electrodes for perpendicular magnetic tunnel junctions*", Appl. Phys. Lett. 94, 012512 (2009).

The publications of F. J. A. den Broeder, W. Hoving, and P. J. H. Bloemen, "*Magnetic anisotropy of multilayers*", J. Magn. Magn. Mater. 93, 562-570 (1991) and M. T. Johnson, P. J. H. Bloemen, F. J. A. den Broeder, and J. J. de Vries, "*Magnetic anisotropy in metallic multilayers*", Rep. Prog. Phys. 59, 1409-1458 (1996) also describe stacks with out of plane magnetisations. Said stacks are usually constituted of repetitions of a first layer of non-magnetic metal, for example platinum or palladium, on which is deposited a second layer of magnetic metal, for example cobalt or alloy based on Co, Ni and Fe.

Nevertheless, said stacks cannot be used alone in memory cells. In fact, in order for said stacks to have significant out of plane magnetisation, they must have a thickness less than 1 nm. On the other hand, to obtain a memory cell having an optimal magnetoresistance tunnel, it is necessary to have multilayers that have a magnetic thickness of at least 1.5 nm in contact with the tunnel barrier. It is thus possible to obtain a magnetoresistance of at least 100% in the case of an MgO barrier. A solution to overcome this problem is to deposit an additional layer of sufficient thickness to ensure a large amplitude of magnetoresistance (in other words at least 60%) on the stack with out of plane magnetisation. By exchange bias through the interface between said additional layer and the layer with out of plane magnetisation, the magnetisation of the additional layer will be drawn out of the plane if the perpendicular anisotropy of the stack is sufficient. In the case of strong coupling and assuming that the anisotropy of the additional layer is uniquely due the shape effect, the criterion to obtain the perpendicular anisotropy is:

$$K^{eff}_1 t_1 > K^{eff}_2 t_2 = 2\pi t_2 Ms_2^2 \quad (1)$$

with $K^{eff}_1$ the effective anisotropy per unit of volume of the stack with perpendicular magnetisation taking into account both the perpendicular anisotropy that draws the magnetisation of said layer outside of the plane and the shape anisotropy thereof, which tends to pull its magnetisation into the plane, $t_1$ the magnetic thickness of the stack with perpendicular magnetisation, $Ms_2$ the magnetisation of the additional layer and $t_2$ the thickness of the additional layer.

$2\pi t_2 Ms_2^2$ is the shape anisotropy term due to the demagnetising field in a thin magnetic layer.

The stability criterion of a memory cell is then expressed as $S^*(K^{eff}_1 t_1 - 2\pi t_2 Ms_2^2) > 50 k_B T$, S being the section of the memory cell. For a cylindrical memory cell, a minimum diameter is obtained equal to:

$$d_{min} = \sqrt{\frac{200 k_B T}{\pi (K^{eff}_1 t_1 - 2\pi t_2 Ms_2^2)}} \quad (2)$$

In order to obtain a minimal diameter $d_{min}$ as low as possible, it is advisable to maximise the denominator of equation (2). This can be done either by increasing the total thickness of the stack $t_1$, which is not desirable for writing by spin transfer because that leads to increasing the current density necessary for the commutation of the magnetisation of said layer by spin transfer, or by maximising the effective anisotropy of the stack with perpendicular anisotropy $K^{eff}1$.

It is thus particularly beneficial to have a magnetic stack with out of plane magnetisation that has the strongest possible effective anisotropy $K^{eff}1$.

In one aspect of the invention there is provided a magnetic stack with out of plane magnetisation that has the strongest possible effective anisotropy. To do this, an embodiment of the invention proposes inserting a layer of copper, magnesium or any material having a low miscibility with the magnetic material between the first layer of non-magnetic metal and the second layer of magnetic metal.

More specifically, a first aspect of the invention relates to a magnetic stack with out of plane magnetisation, said stack comprising:

a first magnetic layer constituted of one or more materials taken from the following group: cobalt, iron and nickel and magnetic alloys based on said materials;

a second layer constituted of a metallic material able to confer to an assembly formed by the first and the second layers a perpendicular anisotropy of interfacial origin when the second layer has a shared interface with the first layer, the stack moreover comprising a third layer deposited on the first layer, the second layer being deposited on the third layer, the third layer being constituted of a metallic material having a miscibility less than 10% with the material of the first layer.

Miscibility usually designates the capacity of various materials to mix together. In fact, in binary alloys comprising two components A and B, the miscibility of B in A reflects the capacity of the material B to dilute in a homogeneous manner in the material A. If the material B has a low capacity to dilute in a homogeneous manner in the material A, it is said that it has low miscibility in A or low solubility in A. This capacity of a material to dilute in a homogeneous manner in another is reflected in a known manner by the phase diagram of the binary alloy A-B.

The magnetic stack has an out of plane magnetisation direction at ambient temperature.

In a surprising manner, the fact of adding between the first layer of magnetic metal and the second layer of non-magnetic metal a third layer of metallic material having low miscibility with the material of the first layer, makes it possible to increase the out of plane anisotropy of the stack. When the thickness of said third layer is optimised, typically of the order of one to several atomic planes, the stack then has an out of plane anisotropy greater than that which it would have in the absence of the third layer.

The materials used to form the third layer are materials that do not mix or mix poorly with the materials that constitute the first layer. In other words, the third layer is made of a material that does not or practically does not diffuse in the material of which the first layer is formed.

As stated previously, the presence of the third layer makes it possible to increase the out of plane anisotropy of the stack when it is deposited directly on the first layer and the second layer is itself deposited directly on the third layer. On the other hand, if one does the opposite, in other words if the third layer is deposited on the second layer, then the first layer is deposited on the third layer, the out of plane anisotropy of the stack is not increased but instead decreased.

Furthermore, the stack according to an embodiment of the invention is particularly beneficial in that it conserves good out of plane anisotropy even after annealing between 250° C. and 350° C.

Furthermore, the fact of adding the third layer between the first and the second layer enables the stack to have a reduced Curie temperature compared to that which it would have if it did not comprise the third layer while conserving an out of plane magnetisation.

The stack may also have one or more of the following characteristics, taken individually or according to any technically possible combinations thereof.

In an embodiment, the second layer is constituted of one or more materials taken from the following group: platinum, palladium, gold, iridium, molybdenum.

In an embodiment, the third layer is constituted of a material taken from the following group: copper, silver, magnesium, aluminium. These materials have less than 10% miscibility with the material of the first layer.

According to a non limiting embodiment, the third layer has a thickness comprised between 0.2 and 1.5 nm. In fact, below 0.2 nm, the first layer may not be entirely covered by the third layer. Furthermore, the fact of increasing the thickness of the third layer above 1.5 nm may not make it possible to increase the out of plane anisotropy of the stack. Thus it is not desirable to deposit a third layer thicker than 1.5 nm.

According to a non limiting embodiment, the first layer is a layer of cobalt that has a thickness less than 0.3 nm, for example strictly less than 0.3 nm. Thus, the stack has a Curie temperature of the order of 150° C., which makes it possible to easily make the magnetisation of the stack switch over by means of the temperature to make it go from an out of plane magnetisation to an in plane magnetisation.

According to a non limiting embodiment, the first layer has a thickness less than or equal to 2 nm. In fact, above 2 nm, the fact of inserting the third layer between the first and the second layer may no longer make it possible to increase in a significant manner the out of plane anisotropy of the stack.

According to a non limiting embodiment, the first and the second layer each have a thickness greater than 0.2 nm. In fact, below 0.2 nm, said layers may not make it possible to cover entirely the layers on which they are deposited.

A second aspect of the invention relates to a multilayer comprising at least one first and one second stack according to the first aspect of the invention, the multilayer having an out of plane magnetisation, the first layer of the second stack being deposited on the second layer of the first stack.

The multilayer has an out of plane direction of magnetisation at ambient temperature.

In fact, to have a multilayer that has as high as possible out of plane anisotropy, in each stack, it is desirable that the third layer be deposited on the first layer and the second layer be deposited on the third layer. On the other hand, it is desirable that the first layer of the second stack be deposited directly on the second layer of the first stack.

The fact of stacking several stacks according to the first aspect of the invention makes it possible to form a multilayer having an out of plane anisotropy of thickness greater than 1 nm.

The multilayer may also have one or more of the following characteristics, taken individually or in any technically possible combinations thereof.

According to a non limiting embodiment, the multilayer further comprises an additional layer of magnetic material deposited on the stacks. The fact of depositing an additional layer on the stacks makes it possible to increase the magnetic thickness, while conserving an out of plane anisotropy for the multilayer. In fact, the stacks of the multilayer have a very important out of plane anisotropy such that they make it possible to "draw" the magnetisation of the additional layer out of plane by magnetic coupling through the interface between the additional layer and the stacks of the multilayer. To do this, it is desirable that the total anisotropy energy of the stacks of the multilayer is greater than that of the additional layer so that it is the stacks that draw the magnetisation of the additional layer out of plane and not the opposite, in other words the planar magnetisation of the additional layer does not draw the magnetisation of the multilayer into the plane.

According to a non limiting embodiment, the additional layer is made of one of the following materials: cobalt, iron, nickel or alloys based on said materials.

The additional layer may also comprise one or more of the following elements: B, V, Cr, Zr, Hf, Pt, Pd.

According to a non limiting embodiment, particularly interesting within the scope of MRAM type memory applications, the multilayer has a thickness comprised between 0.5 nm and 4 nm. In an embodiment, the multilayer should have a thickness less than 4 nm so as to keep a moderate magnetic thickness so as to be able to be reversed by spin transfer with current densities supportable by a tunnel barrier in other words typically less than $2.10^7 A/cm^2$. Moreover, the fact of having a thickness greater than 0.5 nm makes it possible to use the multilayer as reference layer or as storage layer in a memory point.

A third aspect of the invention also relates to a memory cell comprising:
a first magnetic multilayer known as "reference layer";
a second magnetic multilayer known as "storage layer", the storage layer having a variable direction of magnetisation;
a spacer that separates the reference layer and the storage layer;
the reference layer and/or the storage layer comprising a multilayer according to the second aspect of the invention.

The memory cell thereby formed is particularly beneficial because it can have very small lateral dimensions, in other words typically less than 45 nm, while having good thermal stability.

A fourth aspect of the invention relates to a magnetic random access memory comprising a memory cell according to the third aspect of the invention.

Other characteristics and benefits of embodiments of the invention will become clearer on reading the description that follows, with reference to the appended figures, which illustrate:

FIG. 1a, a sectional view of a stack according to an embodiment of the invention;

FIG. 1b, a phase diagram of the binary alloy Co—Cu;

FIG. 2, a sectional view of a multilayer according to an embodiment of the invention;

FIG. 3, a curve that represents the evolution of the effective magnetic anisotropy $K^{eff}$ in a multilayer according to an embodiment of the invention and a multilayer of the prior art, the multilayers comprising a layer of cobalt, as a function of the thickness of the layer of cobalt;

FIG. 4, a curve representing the evolution of the effective magnetic anisotropy $K^{eff}$ as a function of the thickness of the layer of cobalt in a multilayer of the prior art and the multilayer of FIG. 2;

FIG. 5, a curve representing the evolution of the saturation magnetisation Ms in the multilayer of FIG. 2 and in a multilayer of the prior art as a function of the thickness of the cobalt layer;

FIG. 6, a curve representing the evolution of the effective magnetic anisotropy $K^{eff}$ in the multilayer of FIG. 2 and in a multilayer according to the prior art as a function of the annealing temperature of said multilayers;

FIG. 7a, a sectional view of a multilayer according to an embodiment of the invention;

FIG. 7b, a sectional view of a multilayer according to the prior art;

FIGS. 8a to 8d, hysterisis loops measured by polar Kerr effect in multilayers of the prior art;

FIGS. 8e to 8h, hysterisis loops measured by polar Kerr effect in multilayers according to different embodiments of the invention;

FIG. 9, a curve representing the evolution of the saturation magnetisation at the temperature T on the saturation magnetisation at 25° C. of multilayers according to an embodiment of the invention as a function of the temperature;

FIG. 10a, hysterisis loops measured by polar Kerr effect in a multilayer according to an embodiment of the invention at different temperatures;

FIG. 10b, hysterisis loops measured by polar Kerr effect in a multilayer according to another embodiment of the invention at different temperatures;

FIG. 11, a sectional view of a memory cell according to an embodiment of the invention.

For more clarity, identical or similar components are marked by identical reference signs in all of the figures.

FIG. 1a represents a stack 4 according to an embodiment of the invention. Said stack 4 comprises a first layer 1 made of a magnetic material. Said first layer 1 is constituted of cobalt, but it could also be constituted of iron, nickel, or an alloy of said materials.

The stack 4 also comprises a second layer 2 made of a non-magnetic material. The second layer 2 is constituted of platinum, but it could also be constituted of palladium, gold or a metallic material giving an interfacial perpendicular anisotropy when it forms a shared interface with the material of the first layer 1. Examples of such materials are given in the publications of F. J. A. den Broeder, W. Hoving, and P. J. H. Bloemen, "*Magnetic anisotropy of multilayers*", J. Magn. Magn. Mater. 93, 562-570 (1991) and M. T. Johnson, P. J. H. Bloemen, F. J. A. den Broeder, and J. J. de Vries, "*Magnetic anisotropy in metallic multilayers*", Rep. Prog. Phys. 59, 1409-1458 (1996).

In an embodiment, the first layer 1 has a thickness comprised between 0.2 nm and 1 nm. More specifically, when the first layer 1 is made of cobalt, it may have a thickness greater than 0.2 nm so that it forms a continuous film. When the first layer 1 is made of iron, it may have a thickness greater than 0.2 nm so as to form a continuous film. When the first layer 1 is made of nickel, it may have a thickness greater than 0.3 nm so as to form a continuous film.

According to a non limiting embodiment, the second layer 2 has a thickness greater than 0.2 nm. In fact, below 0.2 nm, the second layer does not make it possible to entirely cover the lower layers.

The stack 4 also comprises a third layer 3 that is inserted between the first layer 1 and the second layer 2. More specifically, the third layer 3 is deposited directly on the first layer 1, and the second layer 2 is deposited directly on the third layer 3.

In this document, the layers may be deposited by cathodic sputtering, evaporation, or any other physical vapour deposition method.

The third layer 3 is made of a metallic material having low miscibility with the first layer 1, in other words a miscibility less than 10%.

Said metallic material may for example be copper, silver, magnesium, aluminium. These materials have a very low coefficient of diffusion in the material that constitutes the first layer 1 such that they serve as diffusion barrier between the first and the second layer.

By way of example, FIG. 1b represents the phase diagram of the binary alloy Co—Cu. The low miscibility of copper in cobalt is shown in this phase diagram by the presence of two branches 30 and 31 representing the concentration of copper in cobalt. The fact that said two branches 30, 31 are virtually tangential to the vertical axis if one extrapolates towards ambient temperature shows that one can introduce extremely little copper in cobalt in a homogeneous manner: here less than 1% at ambient temperature. In the same way, one can introduce extremely little cobalt in copper in a homogeneous manner.

This means that if it is sought to mix a lot of copper in cobalt, the copper is going to essentially precipitate in the form of small particles or filaments of copper dispersed in the cobalt matrix but is not going to mix in a homogeneous manner. It is said in this case that copper has a low miscibility with cobalt.

In contrast, the alloys CoNi for example are known to form solid solutions over the whole concentration range of nickel in cobalt. It is then said that Ni has a high miscibility with cobalt.

The third layer 3 enables the stack to have a strong perpendicular anisotropy.

In this document, it is said that a stack, a layer, a multilayer . . . has a "perpendicular anisotropy" or an "out of plane anisotropy", when said stack, said layer, said multilayer extends in parallel to a reference plane, here the plane xy, and that said stack, said layer, or said multilayer has a magnetisation directed along an axis perpendicular to the reference plane, here the z axis.

FIG. 2 represents a multilayer 10 according to an embodiment of the invention.

Said multilayer 10 may comprise a buffer layer 5. Said buffer layer 5 serves as base for the growth of the other layers of the multilayer 10 and favours the adherence of the multilayer on the substrate. Said buffer layer 5 is made of a non-magnetic material. It may for example be made of tantalum. It may for example have a thickness of 3 nm.

On the buffer layer 5, a layer made of non-magnetic material 6 may be deposited. Said layer made of non-magnetic material 6 makes it possible to give good crystalline structure to the rest of the multilayer. Said layer made of non-magnetic material 6 may for example be of platinum and have a thickness of 5 nm.

The multilayer 10 then comprises a succession of n stacks 4a, 4b, . . . 4n. Each stack 4a, 4b, . . . 4n is identical to the stack 4 described with reference to FIG. 1.

The stacks are deposited one above the other such that the first layer 1b of the second stack 4b is deposited on the second layer 2a of the first stack 4a. In the same way, the first layer 1n of the n-th stack 4n is deposited on the second layer 2(n-1) of the stack n-1 and so on. As a function of the number of repetitions, the total thickness of the multilayer can thus vary from 0.5 nm to 50 nm.

In the multilayer 10, on each first layer 1a, 1b, . . . , 1n of cobalt is thus found a third layer 3a, 3b, . . . , 3n of copper, silver, magnesium, aluminium or any other metal weakly miscible with the layer 1a, 1b, . . . , 1n that is inserted between the first layer 1a, 1b, . . . , 1n and the second layer 2a, 2b, . . . , 2n. On the other hand, under each first layer 1a, 1b, . . . , 1n is found directly a layer, 2a, 2b, . . . , 2n-1 made of platinum, palladium or another metal known to give an interfacial perpendicular anisotropy when it forms a shared interface with the material constituting the layers 1a, 1b, . . . 1n, without having a layer of copper inserted between the first layer of the upper stack and the second layer of the lower stack. This lay out makes it possible to have a multilayer 10 that has strong out of plane anisotropy.

The multilayer 10 may also comprise a layer 7 or a series of layers 7 and 8 deposited at the top of the stack with an aim of protection for example to protect it from oxidation in the air. These protective layers may for example be made of tantalum 7 which has a thickness of 2 nm and a layer of platinum 8 which also has a thickness of 2 nm.

The multilayer thereby produced has an out of plane magnetisation.

FIG. 3 represents the evolution of the effective magnetic anisotropy in three multilayers comprising a layer of cobalt as a function of the thickness of the cobalt layer.

Thus, curve 303 represents the evolution, as a function of the thickness of the first layer of cobalt, of the effective magnetic anisotropy $K^{eff}$ in a multilayer of the prior art that comprises:
a buffer layer of tantalum of 3 nm thickness;
a layer of platinum of 5 nm thickness;
a first layer of cobalt, the thickness $t_{Co}$ of which varies;
a second layer of platinum of 2 nm thickness.

The curve 302 represents the evolution, as a function of the thickness of the first layer of cobalt, of the effective magnetic anisotropy $K^{\it{eff}}$ in a multilayer according to an embodiment of the invention that comprises:
- a buffer layer of tantalum of 3 nm thickness;
- a layer of platinum of 5 nm thickness;
- a stack comprising:
- a first layer of cobalt, the thickness $t_{Co}$ of which varies;
- a third layer of copper of 0.4 nm thickness;
- a second layer of platinum of 2 nm thickness.

As may be seen on these curves, when the first layer of cobalt has a thickness $t_{Co}$ less than 1 nm, the presence of a third layer of copper on the first layer of cobalt makes it possible to increase the effective magnetic anisotropy $K^{\it{eff}}$, which signifies that when the third layer is present on the first layer, the stack has an out of plane magnetic anisotropy greater than that which the stack would have in the absence of said third layer. In fact, a stack of the prior art comprising:
- a layer of tantalum of 3 nm thickness;
- a layer of platinum of 5 nm thickness;
- a first layer of cobalt of 0.5 nm thickness;
- a second layer of platinum of 2 nm thickness;

has a magnetisation substantially equal to 950 emu/cm$^3$, which corresponds to 95.10$^4$ A/m and it has an effective magnetic anisotropy $K^{\it{eff}}$ of 4.13 Merg/cm$^3$, which corresponds to 4.130.10$^5$ J/m$^3$.

If a third copper layer of 0.4 nm thickness is added between the first and the second layer of said stack, the stack
has a magnetisation substantially equal to 1020 emu/cm$^3$, which corresponds to 102.10$^4$ A/m and it has an effective magnetic anisotropy $K^{\it{eff}}$ of 9.18 Merg/cm$^3$, which corresponds to 9.18.10$^5$ J/m$^3$.

If a third layer of magnesium of 0.4 nm thickness is added between the first and the second layer of the stack of the prior art described above, the stack then has a magnetisation substantially equal to 1020 emu/cm$^3$, which corresponds to 102.10$^4$ A/m and it has an effective anisotropy $K^{\it{eff}}$ of 7.27 Merg/cm$^3$, which corresponds to 7.270.10$^5$ J/m$^3$.

Thus, the stacks according to an embodiment of the invention have magnetisations greater than those of stacks of the prior art on account of the presence of the third layer between the first and the second layer which avoids the diffusion of the material constituting the first layer into the second layer 2 and vice versa. Moreover, the stacks according to an embodiment of the invention have perpendicular magnetic anisotropies greater than those of the prior art.

FIG. 4 represents the evolution of the effective magnetic anisotropy $K^{\it{eff}}$ in two multilayers comprising several identical stacks each comprising a first layer of cobalt as a function of the thickness of the first layers of cobalt.

Thus, curve 401 represents the evolution of the anisotropy coefficient in a multilayer similar to that of FIG. 2 as a function of the thickness of the first layers of cobalt.

Curve 402 represents the evolution of the anisotropy coefficient in a multilayer similar to that of FIG. 2 with the difference that said multilayer does not comprises a third layer on the first layers of cobalt.

As may be seen on FIG. 4, the multilayer that comprises a third layer of copper on each of the first layers of cobalt thereof has an effective magnetic anisotropy $K^{\it{eff}}$ more important than the multilayer that does not comprise a third layer. Thus, the multilayer that comprises a third layer of copper between each first layer of cobalt and each second layer of platinum has an out of plane anisotropy of interfacial origin greater than that of the multilayer that does not comprise a third layer.

FIG. 5 represents the evolution of the saturation magnetisation in two multilayers comprising a first layer of cobalt as a function of the thickness of the first layer of cobalt.

Thus, curve 501 represents the evolution of the saturation magnetisation in a multilayer similar to that of FIG. 2 as a function of the thickness of the first cobalt layers.

Curve 502 represents the evolution of the saturation magnetisation in a multilayer similar to that of FIG. 2 with the difference that said multilayer does not comprise a third layer on the first cobalt layers.

As may be seen on FIG. 5, the multilayer that comprises third layers of copper on each of the first cobalt layers thereof has a magnetisation with higher saturation than the multilayer that does not comprise a third layer.

FIG. 6 represents the evolution of the effective magnetic anisotropy $K^{\it{eff}}$ as a function of the annealing temperature of two multilayers.

More specifically, the curve 602 represents the evolution of the effective magnetic anisotropy $K^{\it{eff}}$ in a multilayer that comprises:
- a layer of tantalum of 3 nm thickness;
- a layer of platinum of 5 nm thickness;
- three stacks each comprising:
- a first layer of cobalt of 0.6 nm thickness;
- a second layer of platinum of 0.4 nm thickness;
- a layer of tantalum of 2 nm thickness;
- a layer of platinum of 2 nm thickness.

The curve 601 represents the evolution of the anisotropy coefficient $K^{\it{eff}}$ in a multilayer that comprises:
- a layer of tantalum of 3 nm thickness;
- a layer of platinum of 5 nm thickness;
- three stacks each comprising:
- a first layer of cobalt of 0.4 nm thickness;
- a third layer of copper of 0.4 nm thickness;
- a second layer of platinum of 0.4 nm thickness;
- a layer of tantalum of 2 nm thickness;
- a layer of platinum of 2 nm thickness.

As may be seen on these curves, whatever the annealing temperature $T_A$ comprised between 0 and 350° C. at which the multilayers of the curves 601 and 602 are annealed, the multilayer of curve 601 which comprises a third layer of copper on each first layer of cobalt has an effective magnetic anisotropy greater than that of the multilayer of curve 602 which does not comprise a third layer.

This characteristic is particularly interesting because in this way the multilayers according to an embodiment of the invention can be used in memory cells having tunnel barriers, particularly of magnesium or aluminium oxides, without the annealing of the memory point destroying the perpendicular anisotropy of the multilayer.

FIG. 7a represents a multilayer 11 according to an embodiment of the invention. Said multilayer 11 comprises:
- a layer of tantalum 13 of 3 nm thickness;
- a layer of platinum 14 of 5 nm thickness;
- three stacks 4a, 4b, 4c each comprising:
- a first layer of cobalt of 0.3 nm thickness;
- a third layer of copper of 0.4 nm thickness;
- a second layer of platinum of 0.4 nm thickness;
- an additional layer 15 of cobalt-iron-boron alloy of thickness $t_{CoFeB}$;
- a layer of aluminium oxide 16 of 0.55 nm thickness;
- a layer of tantalum 17 of 2 nm thickness;
- a layer of platinum 18 of 2 nm thickness.

FIG. 7b represents a multilayer 12 of identical composition to that of FIG. 7a with the exception of the fact that the stacks do not comprise a third layer on each first layer of copper. More specifically, the multilayer 12 comprises:
- a layer of tantalum 13 of 3 nm thickness;
- a layer of platinum 14 of 5 nm thickness;
- three stacks 19a, 19b, 19c each comprising:
  - a first layer of cobalt of 0.3 nm thickness;
  - a second layer of platinum of 0.4 nm thickness;
- an additional layer 15 of cobalt-iron-boron alloy of thickness $t_{CoFeB}$;
- a layer of aluminium oxide 16 of 0.55 nm thickness;
- a layer of tantalum 17 of 2 nm thickness;
- a layer of platinum 18 of 2 nm thickness.

Said hysterisis loops have been obtained by polar Kerr effect, by applying a magnetic field perpendicularly to the plane of the layers. The experimental protocol making it possible to obtain said hysterisis loops by polar Kerr effect is known from the prior art and it is for example described in the books entitled "*Magnétisme, Fondements (Tome 1)*" and "*Magnétisme, Matériaux et applications (Tome 2)*" edited by E. Du Tremolet de Lacheisserie, Grenoble Sciences. These measurements were carried out with a helium-neon laser of 632 nanometres wavelength and rectilinearly polarised.

Figure 1A:
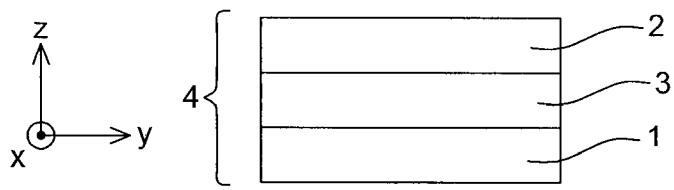
Figure 1B:
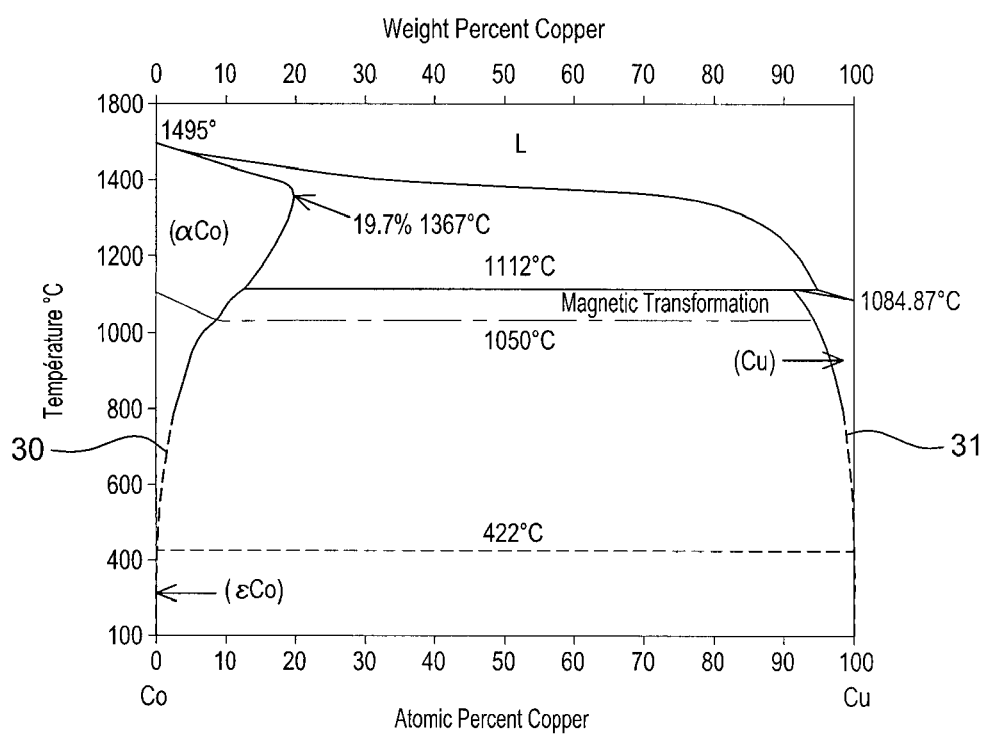
Figure 2:
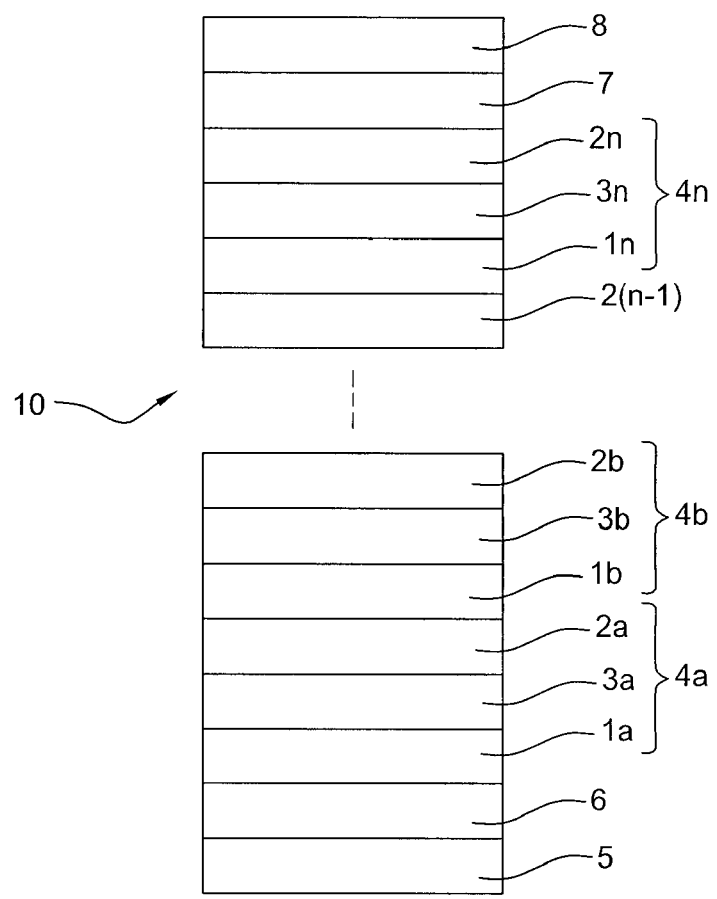
Figure 3:
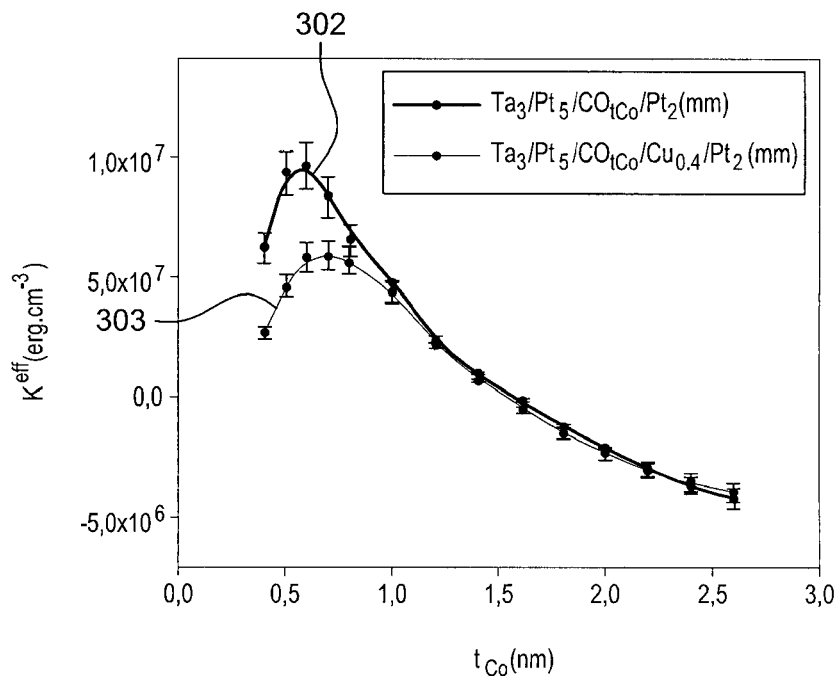
Figure 4:
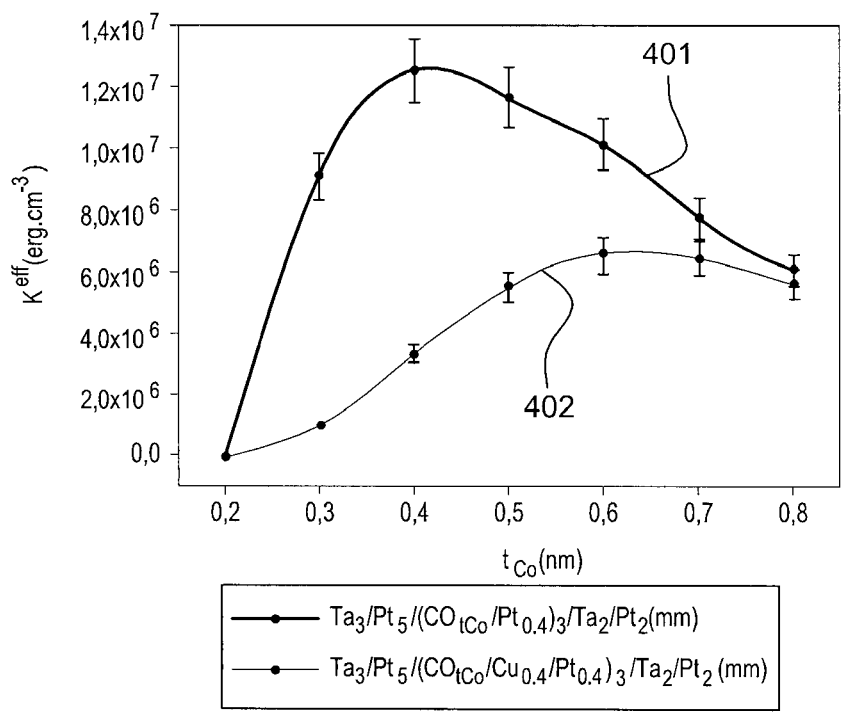
Figure 5:
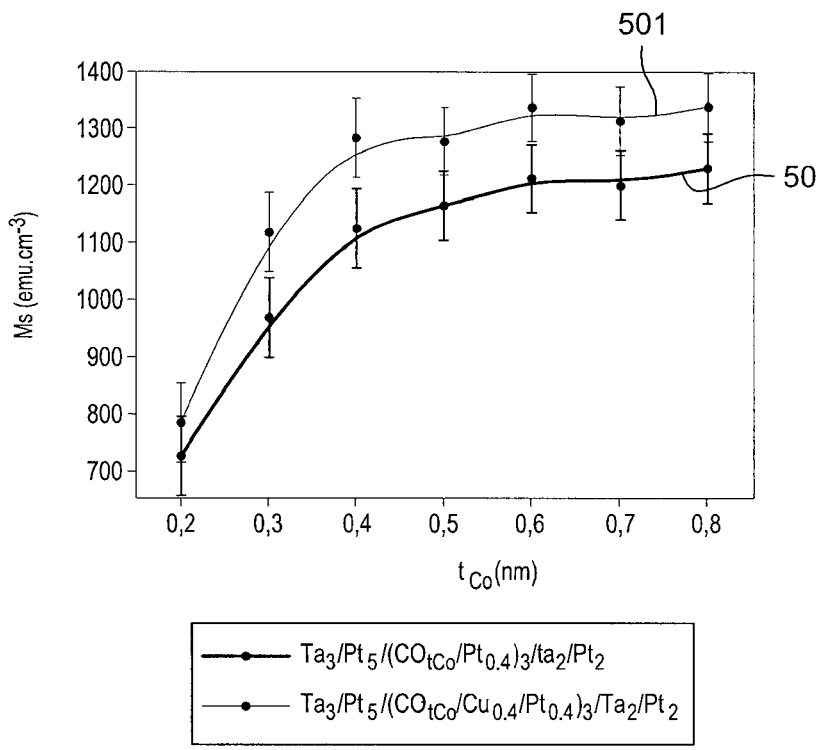
Figure 6:
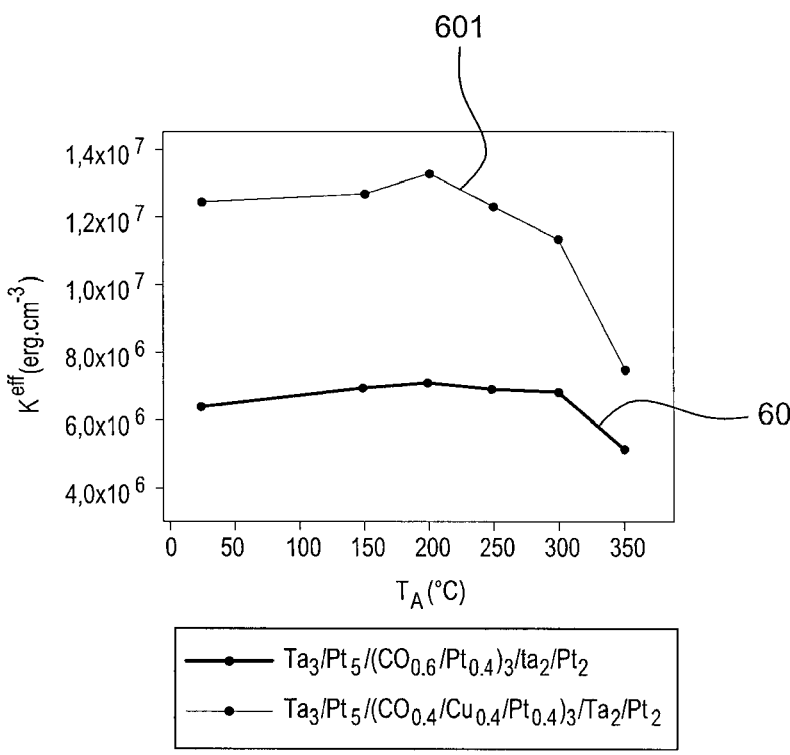
Figure 8A:
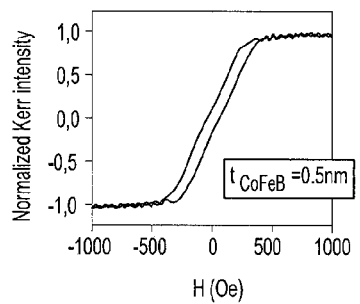
FIG. 8a represents a hysterisis loop measured by polar Kerr effect for the multilayer 12 of FIG. 7b when the additional layer 15 has a thickness of 0.5 nm.
Figure 8E:
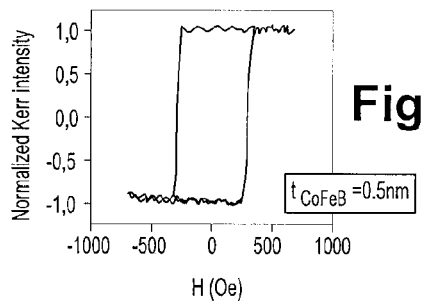
FIG. 8e represents a hysterisis loop measured by polar Kerr effect for the multilayer 11 of FIG. 7a when the additional layer 15 has a thickness of 0.5 nm.
Figure 8B:
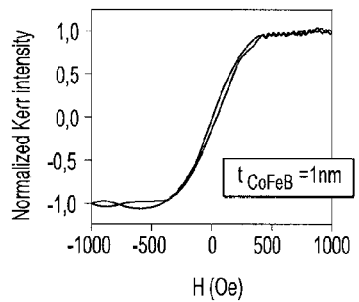
FIG. 8b represents a hysterisis loop measured by polar Kerr effect for the multilayer 12 of FIG. 7b when the additional layer 15 has a thickness of 1 nm.
Figure 8F:
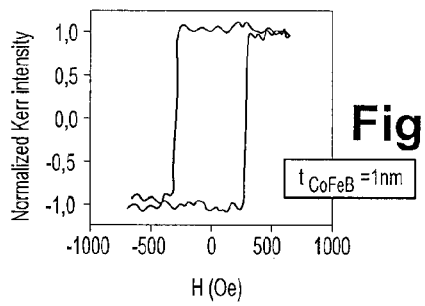
FIG. 8f represents a hysterisis loop measured by polar Kerr effect for the multilayer 11 of FIG. 7a when the additional layer 15 has a thickness of 1 nm.
Figure 8C:
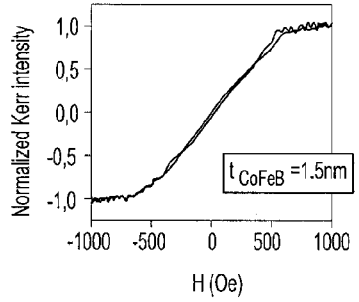
FIG. 8c represents a hysterisis loop measured by polar Kerr effect for the multilayer 12 of FIG. 7b whet the additional layer 15 has a thickness of 1.5 nm.
Figure 8G:
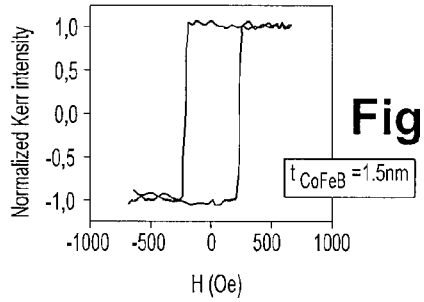
FIG. 8g represents a hysterisis loop, measured by polar Kerr effect for the multilayer 11 of FIG. 7a when the additional layer 15 has a thickness of 1.5 nm.
Figure 8D:
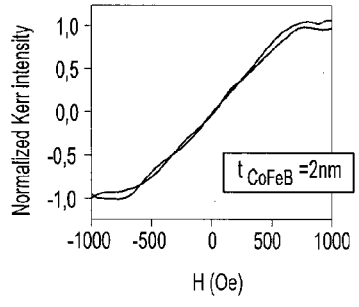
FIG. 8d represents a hysterisis loop measured by polar Kerr effect for the multilayer 12 of FIG. 7b when the additional layer 15 has a thickness of 2 nm.
Figure 8H:
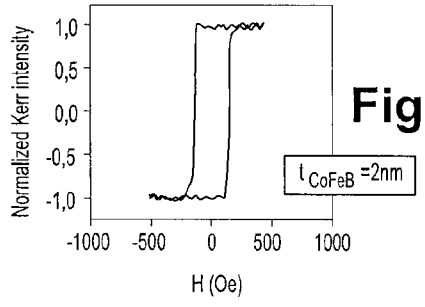
FIG. 8h represents a hysterisis loop measured by polar Kerr effect for the multilayer 11 of FIG. 7a when the additional layer 15 has a thickness of 2 nm.

FIGS. 8e to 8f show that the presence of a third layer of copper 3 on the first layer of cobalt 1 makes it possible to confer to the multilayer 11 a magnetisation perpendicular to the plane of the multilayer, the effective anisotropy of which is sufficient to "draw" out of plane the magnetisation of the additional layer 15. In fact, when the stacks 4a to 4c comprise a third layer of copper, magnesium, or any other metal with low miscibility in the layer 1, they have a higher out of plane anisotropy, such that they draw the magnetisation of the additional layer out of plane, even when the additional layer 15 has an important thickness which can attain values of the order of 2 nm.

On the other hand, FIGS. 8a to 8d show that in the absence of a third layer 3 in the multilayer 12, the multilayer has a magnetisation in the plane of the layer. In fact, in this case the anisotropy of the stacks 19a to 19c is not sufficient to "draw" the magnetisation of the additional layer out of plane of the additional layer 15.

Thus, the presence of the third layer in the stacks makes it possible to render the magnetisation of the multilayer perpendicular to the plane of the multilayer whereas, without a third layer, the multilayer would have a magnetisation parallel to the plane of the multilayer.

FIG. 9 represents the evolution of the magnetisation in the multilayers as a function of the temperature of said multilayers.

More specifically, the curves 801, 802, 803 each represent the evolution, as a function of the temperature T, of the ratio of the saturation magnetisation Ms(T) of a multilayer at the temperature T over the saturation magnetisation Ms(25° C.) of this same multilayer at 25° C.

The multilayers used for the curves 801, 802 and 803 have the following composition:
- a layer of tantalum of 3 nm thickness;
- a layer of platinum of 5 nm thickness;
- five stacks each comprising:
  - a first layer of cobalt of thickness $t_{Co}$;
  - a third layer of copper of 0.4 nm thickness;
  - a second layer of platinum of 0.4 nm thickness;
  - a layer of cobalt of 0.5 nm thickness;
  - a layer of ruthenium of 0.9 nm thickness;
- a layer of tantalum of 2 nm thickness;
- a layer of platinum of 2 nm thickness.

The multilayer used to produce the curve 801 has first layers of cobalt that each have a thickness $t_{Co}$=0.4 nm.

The multilayer used to produce the curve 802 has first layers of cobalt that each have a thickness $t_{Co}$=0.3 nm.

The multilayer used to produce the curve 803 has first layers of cobalt that each have a thickness $t_{Co}$=0.2 nm.

These curves show that the Curie temperature, in other words the temperature from which the spontaneous magnetisation of the multilayer becomes zero, diminishes when the thickness $t_{Co}$ of the first layer of cobalt of each stack diminishes. This reduction of the Curie temperature is essentially linked to a finite size effect, in other words a lowering in the coordination of the atoms of cobalt in other words the number of their cobalt neighbours bringing about an effective reduction in exchange interactions within the layer of cobalt. It is thus a general phenomenon whatever the nature of the third layer in contact with the first layer. Said Curie temperature is a vital factor for controlling the anisotropy switching temperature, a phenomenon described in the publication of P. J. Jensen et al., Phys. Rev. B 42, 849 (1990).

Generally speaking, to obtain a Curie temperature substantially equal to 150° C., it is desirable to have a first layer of cobalt in each stack which has a thickness $t_{Co}$ less than 0.3 nm, and for example strictly less than 0.3 nm. Yet with such thicknesses of the first layer of cobalt, the stack can only conserve an out of plane anisotropy at ambient temperature in the presence of the third layer on each first layer of the stack. The presence of the third layer of copper, magnesium or any other metal having low miscibility with the first layer of cobalt thus makes it possible to have a multilayer having both a perpendicular anisotropy at ambient temperature and a reduced Curie temperature.

FIG. 10a represents the hysterisis loop measured by polar Kerr effect in a multilayer according to an embodiment of the invention comprising:
- a layer of tantalum of 3 nm thickness;
- a layer of platinum of 5 nm thickness;
- five stacks each comprising:
  - a first layer of cobalt of 0.25 nm thickness;
  - a third layer of copper of 0.4 nm thickness;
  - a second layer of platinum of 0.4 nm thickness;
  - a layer of cobalt-iron-boron alloy of 1.5 nm thickness;
- a layer of aluminium oxide of 0.55 nm thickness;
- a layer of tantalum of 2 nm thickness;
- a layer of platinum of 2 nm thickness.

FIG. 10b represents the hysterisis loop measured by polar Kerr effect for a multilayer similar to that of FIG. 10a with the exception of the fact that the first layer of cobalt of each stack has a thickness of 0.3 nm instead of having a thickness of 0.25 nm. To produce the hysteresis loops of FIGS. 10a and 10b, a magnetic field has been applied perpendicularly to the plane of the layers.

As may be seen in FIG. 10a, when the temperature is increased, the direction of magnetisation of the multilayer switches over. In fact, when the multilayer is at ambient temperature, it has a direction of magnetisation perpendicular to the plane of the multilayer, whatever the thickness of the first layer of cobalt. On the other hand, when the temperature rises, the perpendicular effective anisotropy that draws the out of plane magnetisation diminishes and changes sign at a certain temperature. Said change of sign corresponds to the fact that the shape anisotropy which tends to pull the magnetisation of the magnetic layer into the plane then wins over the perpendicular anisotropy of volumic or interfacial origin which tends to draw the out of plane magnetisation. At said critical temperature of change of sign of the effective anisotropy, the magnetisation of the magnetic layer is reoriented abruptly from a direction perpendicular to the plane below said temperature to a direction in the plane above said temperature. In FIG. 10a, it may be seen that, when the first layer of cobalt has a thickness of 0.25 nm, the switching temperature is close to 150° C., whereas when the first layer of cobalt has a thickness of 0.3 nm, the switching temperature is greater than 200° C.

Yet, it is particularly beneficial to have a multilayer that has a low anisotropy switching temperature, in other words of the order of 150° C., especially when the multilayer is used as storage layer in a memory cell, as will be seen with reference to FIG. 11.

FIG. 11 represents a memory cell according to an embodiment of the invention.

Said memory point comprises a first multimagnetic layer known as "reference layer" 21. The reference layer 21 has a direction of magnetisation perpendicular to the plane of the reference layer. Moreover, the reference layer has a fixed direction of magnetisation. To do this, the direction of magnetisation of the reference layer 21 may for example be trapped by an antiferromagnetic layer 24 with which the reference layer 21 is in contact. The reference layer 21 may be formed in a multilayer according to an embodiment of the invention as described previously.

The memory point also comprises a second magnetic multilayer known as "storage layer" 22, the storage layer 22 having a variable direction of magnetisation. At ambient temperature, when the memory cell is not being written, the direction of magnetisation of the storage layer may be placed so as to be:

parallel to the direction of magnetisation of the reference layer, in this case a "0" is written in the storage layer, or instead antiparallel to the direction of magnetisation of the reference layer, and in this case a "1" is written in the storage layer.

The storage layer 22 is produced in a multilayer according to an embodiment of the invention, which comprises in this example the following elements:
 a layer of tantalum of 3 nm thickness;
 a layer of platinum of 5 nm thickness;
 five stacks each comprising:
  a first layer of cobalt;
  a third layer of copper of 0.4 nm thickness;
  a second layer of platinum of 0.4 nm thickness;
 an additional layer 15 of cobalt-iron-boron alloy of 1.5 nm thickness.

The first layer of each stack may have a thickness of 0.25 nm or 0.3 nm. As explained with reference to FIGS. 10a and 10b, when the first layer of cobalt of each stack has a thickness of 0.25 nm, the storage layer 22 has an anisotropy switching temperature of the order of 150° C., whereas when the first layer of cobalt of each stack has a thickness of 0.3 nm, the storage layer 22 has an anisotropy switching temperature greater than 200° C.

The memory cell also comprises a spacer 23 that separates the reference layer 21 and the storage layer 22. The spacer 23 forms a tunnel barrier between the reference layer 21 and the storage layer 22. The spacer 23 is constituted in this example of a layer of aluminium oxide of 0.55 nm thickness.

The memory cell also comprises a transistor 25 that can be placed in a passing state so to enable the passage of a flow of electrons through the memory cell.

In an embodiment, the memory cell is written by spin transfer. Thus, a flow of electrons passes through the memory cell. When said flow of electrons passes through the reference layer 21, which is magnetic, the spins of the electrons are going to find themselves spin polarised, such that the electrons will come out of said reference layer 21 with a polarised spin. When said electrons pass through the storage layer 22, they are going to undergo exchange interactions with the spins responsible for the magnetisation of the storage layer 22. If the current density is sufficiently strong, this is going to bring about a reorientation of the magnetisation of the storage layer and an alignment of the magnetisation of the storage layer by transfer of the angular moment of the electrons polarised at the magnetic moment of the storage layer 22. This phenomenon is also known as spin transfer. Thus, if the current of electrons flows from the reference layer to the storage layer, spin transfer is going to favour the parallel orientation of the magnetisations of the storage and reference layers. On the other hand, if the current of electrons flows from the storage layer to the reference layer, it is the antiparallel alignment that is favoured.

Furthermore, the spin transfer torque varies as the sine of the angle between the direction of spin polarisation of the electrons and the magnetisation on which said torque is exerted. Consequently said torque is increased when the storage and reference layers have magnetisation directions perpendicular to each other. Yet, at rest, at ambient temperature, the reference 21 and storage 22 layers both have directions of magnetisations perpendicular to the plane of said layers and consequently, at ambient temperature, the reference 21 and storage 22 layers have directions of magnetisations parallel or antiparallel to each other.

But, when a current passes through the memory cell so as to enable the writing of information in the storage layer, said current causes the heating of the memory cell and in particular the heating of the storage layer, such that the direction of magnetisation of the storage layer switches over to get closer to a direction of magnetisation in the plane of the storage layer. The lower the Curie temperature of the storage layer, the lower the anisotropy switching temperature, and the less the memory cell requires current to be written. Thus, when the storage layer is constituted of a multilayer comprising a first layer of cobalt in each stack of 0.25 nm thickness, the current that passes through the memory cell is sufficient to make the magnetisation of the storage layer switch by 90°, such that the direction of magnetisation of the storage layer becomes perpendicular to the direction of magnetisation of the reference layer. The effect of spin transfer is then maximal, which makes it possible to draw the magnetisation of the storage layer into the "lower" hemisphere or into the "upper" hemisphere, depending on the direction of the current. Then, when the current is cut, the direction of magnetisation of the storage layer straightens up and becomes parallel or antiparallel to the direction of magnetisation of the reference layer, depending on whether the current of electrons has oriented the direction of magnetisation of the storage layer parallel or antiparallel to the direction of magnetisation of the reference layer.

It is thus particularly interesting to have a first layer in each stack that is constituted of a layer of cobalt of 0.25 nm thickness so as to favour spin transfer during the writing of information in the storage layer. This makes it possible to reduce the current density required to write information in the storage layer.

The invention claimed is:

1. A magnetic stack with out of plane magnetisation, said magnetic stack comprising:
    a first magnetic layer constituted of one or more materials selected from the following group: cobalt, iron and nickel and magnetic alloys based on said materials;
    a second layer constituted of a metallic material able to confer to an assembly formed by the first and the second layers a perpendicular anisotropy of interfacial origin when the second layer has a shared interface with the first layer; and
    a third layer deposited on the first layer, the second layer being deposited on the third layer, the third layer being constituted of a metallic material having a miscibility less than 10% with the material of the first layer.

2. The magnetic stack of claim 1, wherein the second layer is constituted of one or more materials selected from the following group: platinum, palladium, gold, iridium, molybdenum.

3. The magnetic stack of claim 1, wherein the third layer is constituted of a material selected from the following group: copper, silver, magnesium, aluminium.

4. The magnetic stack of claim 1, wherein the third layer has a thickness comprised between 0.2 nm and 1.5 nm.

5. The magnetic stack of claim 1, wherein the first layer has a thickness less than or equal to 2 nm.

6. The magnetic stack of claim 1, wherein the first and the second layers each have a thickness greater than 0.2 nm.

7. A multilayer comprising a first and a second stack according to claim 1, the multilayer having an out of plane magnetisation, the first layer of the second stack being deposited on the second layer of the first stack.

8. The multilayer of claim 7, comprising an additional layer of magnetic material deposited on the stacks.

9. The multilayer of claim 8, wherein the additional layer is made of one of the following materials: cobalt, iron, nickel or magnetic alloys based on said materials.

10. The multilayer of claim 9, wherein the additional layer comprises one or more of the following elements: B, V, Cr, Zr, Hf, Pt, Pd.

11. A memory cell comprising:
    a first magnetic multilayer;
    a second magnetic multilayer, the second layer having a variable direction of magnetisation;
    a spacer configured to separate the first magnetic multilayer and the second magnetic multilayer;
wherein the first magnetic multilayer and/or the second magnetic multilayer comprise a multilayer according to claim 7.

12. A magnetic random access memory comprising a memory cell according to claim 11.

* * * * *